(12) United States Patent
Chai

(10) Patent No.: US 11,315,615 B1
(45) Date of Patent: Apr. 26, 2022

(54) GROUP CONTROL CIRCUIT AND SEMICONDUCTOR MEMORY APPARATUS INCLUDING THE SAME

(71) Applicant: SK hynix Inc., Gyeonggi-do (KR)

(72) Inventor: Soo Yeol Chai, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/245,270

(22) Filed: Apr. 30, 2021

(30) Foreign Application Priority Data

Jan. 12, 2021 (KR) .......................... 10-2021-0003948

(51) Int. Cl.
*G11C 8/00* (2006.01)
*G11C 7/22* (2006.01)
*G11C 7/10* (2006.01)

(52) U.S. Cl.
CPC ............ *G11C 7/222* (2013.01); *G11C 7/1012* (2013.01); *G11C 7/1057* (2013.01); *G11C 7/1084* (2013.01)

(58) Field of Classification Search
CPC ..... G11C 7/222; G11C 7/1012; G11C 7/1057; G11C 7/1084
USPC ........................................................ 365/233.1
See application file for complete search history.

(56) References Cited

U.S. PATENT DOCUMENTS 8,305,117 B2    11/2012  De Laurentiis et al.
2007/0058480 A1*  3/2007  Hwang ................ G11C 7/1027
                                                   365/233.1

* cited by examiner

*Primary Examiner* — Huan Hoang
(74) *Attorney, Agent, or Firm* — IP & T Group LLP

(57) ABSTRACT

A group control circuit includes a selection signal generation circuit and first and second activation selection circuits. The selection signal generation circuit generates a source selection signal by synchronizing an entry control signal. The first activation selection circuit generates a plurality of first activation selection signals in synchronization with a first edge clock signal. The second activation selection circuit generates a plurality of second activation selection signals in synchronization with a second edge clock signal. The first and second activation selection circuits have a parallel structure.

20 Claims, 10 Drawing Sheets

GROUP CONTROL CIRCUIT AND SEMICONDUCTOR MEMORY APPARATUS INCLUDING THE SAME

CROSS-REFERENCES TO RELATED APPLICATION

The present application claims priority under 35 U.S.C. § 119(a) to Korean application number 10-2021-0003948, filed on Jan. 12, 2021, which is incorporated herein by reference in its entirety.

BACKGROUND

1. Technical Field

Various embodiments of the present disclosure generally relate to a group control circuit and a semiconductor memory apparatus including the same, and more particularly, to a group control circuit capable of generating a control signal for sequentially controlling a plurality of circuits and a semiconductor memory apparatus including the same.

2. Related Art

In general, integrated circuits including semiconductor apparatuses and semiconductor memory apparatuses have a plurality of internal circuits therein in order to perform various functions. The plurality of internal circuits are designed to be activated according to a preset time point and to perform a preset operation. Among the plurality of internal circuits, there are internal circuits having substantially the same activation point. Furthermore, among the plurality of internal circuits, there are internal circuits having different activation points.

Moreover, the integrated circuit receives a supply voltage and controls various operations of the plurality of internal circuits. In such a case, when the plurality of internal circuits are activated at the same time point, the supply voltage suddenly drops due to a sudden increase in the amount of current instantaneously provided to the plurality of internal circuits. Recently, since the voltage level of the supply voltage applied to the integrated circuit is getting lower and lower, a drop in the supply voltage causes a malfunction of the integrated circuit.

SUMMARY

In an embodiment of the present disclosure, a group control circuit may include: a selection signal generation circuit configured to generate a source selection signal by synchronizing an entry control signal with one of a first edge clock signal and a second edge clock signal; a first activation selection circuit configured to generate a plurality of first activation selection signals that are sequentially activated by synchronizing the source selection signal with the first edge clock signal; and a second activation selection circuit configured to generate a plurality of second activation selection signals that are sequentially activated by synchronizing the source selection signal with the second edge clock signal, wherein the first activation selection circuit and the second activation selection circuit have a parallel structure and the first edge clock signal and the second edge clock signal have different phases.

In an embodiment of the present disclosure, a group control circuit may include: a selection clock generation circuit configured to generate first and second selection clock signals respectively from first and second edge clock signals or vice versa, on the basis of a mode control signal; a selection signal generation circuit configured to generate a source selection signal by synchronizing an entry control signal with one of the first and second edge clock signals; a first activation selection circuit configured to generate a plurality of first activation selection signals that are sequentially activated by alternately synchronizing the source selection signal with the first edge clock signal and the first selection clock signal; and a second activation selection circuit configured to generate a plurality of second activation selection signals that are sequentially activated by alternately synchronizing the source selection signal with the second edge clock signal and the second selection clock signal, wherein the first activation selection circuit and the second activation selection circuit have a parallel structure and the first edge clock signal and the second edge clock signal have different phases.

In an embodiment of the present disclosure, a semiconductor memory apparatus may include: a group control circuit including: a selection signal generation circuit configured to generate a source selection signal by synchronizing an entry control signal with one of a first edge clock signal and a second edge clock signal, a first activation selection circuit configured to generate a plurality of first activation selection signals that are sequentially activated by synchronizing the source selection signal with the first edge clock signal, and a second activation selection circuit configured to generate a plurality of second activation selection signals that are sequentially activated by synchronizing the source selection signal with the second edge clock signal; and a plurality of page buffer circuits activated on the basis of the plurality of first and second activation selection signals and configured to control read and write operations of a memory array circuit, wherein the first activation selection circuit and the second activation selection circuit have a parallel structure and the first edge clock signal and the second edge clock signal have different phases.

In an embodiment of the present disclosure, a semiconductor memory apparatus may include: a group control circuit including: a selection clock generation circuit configured to generate first and second selection clock signals respectively from first and second edge clock signals or vice versa, on the basis of a mode control signal, a selection signal generation circuit configured to generate a source selection signal by synchronizing an entry control signal with one of the first and second edge clock signals, a first activation selection circuit configured to generate a plurality of first activation selection signals that are sequentially activated by alternately synchronizing the source selection signal with the first edge clock signal and the first selection clock signal, and a second activation selection circuit configured to generate a plurality of second activation selection signals that are sequentially activated by alternately synchronizing the source selection signal with the second edge clock signal and the second selection clock signal; and a plurality of page buffer circuits activated on the basis of the plurality of first and second activation selection signals and configured to control read and write operations of a memory array circuit, wherein the first activation selection circuit and the second activation selection circuit have a parallel structure and the first edge clock signal and the second edge clock signal have different phases.

In an embodiment of the present disclosure, an integrated circuit may include: a source pulse circuit configured to generate a source pulse from a control pulse at an edge of one of first and second source clocks having opposite phases to each other; a series of first circuits configured to be activated to sequentially generate first pulses from to the source pulse; and a series of second circuits configured to be activated to sequentially generate second pulses from the source pulse, wherein even ones of the first circuits are sequentially activated at each period of a first even clock and odd ones of the first circuits are activated at each period of a first odd clock, and wherein even ones of the second circuits are sequentially activated at each period of a second even clock and odd ones of the second circuits are activated at each period of a second odd clock.

DETAILED DESCRIPTION

Figure 1:
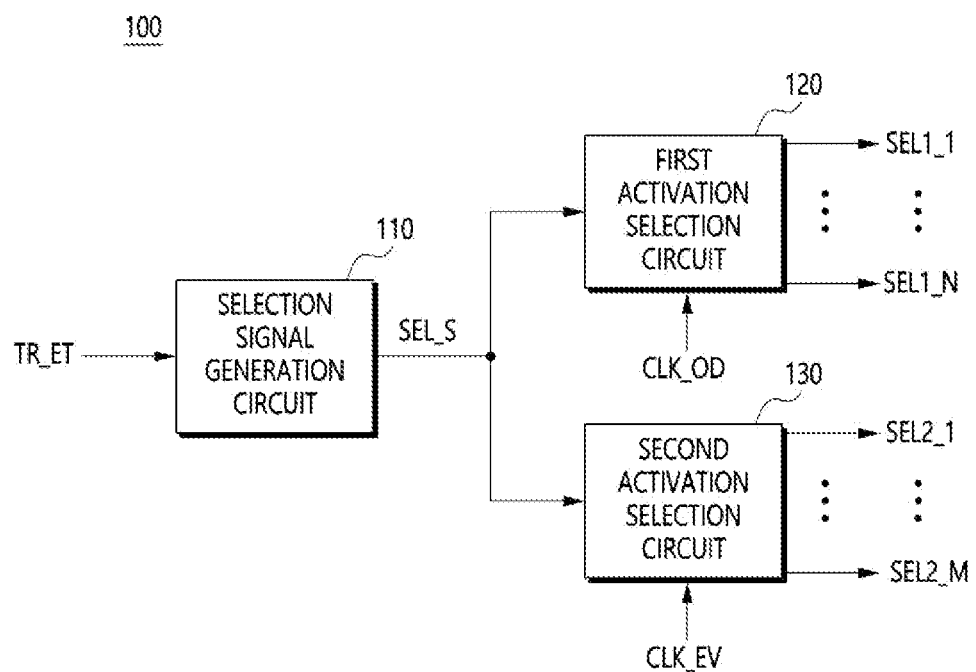
FIG. 1 is a block diagram illustrating a configuration of a group control circuit in accordance with an embodiment of the present disclosure.

The present disclosure provides structural and functional details directed to various embodiments. The scope of the invention, however, is not limited to or by any of the disclosed embodiments nor to any particular detail provided herein. That is, those skilled in the art will understand in view of the present disclosure that any embodiment may be modified in various ways and may have various forms. Accordingly, the invention encompasses all such variations that fall within the scope of the claims including their equivalents. Furthermore, a specific embodiment does not necessarily include all stated objects or effects nor include only such objects and effects. Accordingly, the scope of the invention is not limited thereby.

Throughout the specification, reference to "an embodiment" or the like is not necessarily to only one embodiment, and different references to any such phrase are not necessarily to the same embodiment(s). The term "embodiments" when used herein does not necessarily refer to all embodiments.

Terms, such as "first" and "second", are used to distinguish one element from another element that otherwise have the same or similar names. A first element in one instance may be named a second element in another instance without indicating any substantive change in the element itself.

The singular is intended to include the plural, unless clearly expressed otherwise or it is clear from the context that only one is intended. Open-ended terms such as "include" or "have" should be understood as indicating the existence of stated characteristics, numbers, steps, operations, elements, parts, or combination thereof, but not excluding the possibility that one or more other characteristics, numbers, steps, operations, elements, parts, or combination thereof are present or may be added.

In each step, symbols (e.g., a, b, and c) are used for convenience of a description, not necessarily to indicate any particular order of steps or operations. Consistent with the teachings herein, steps/operations may be performed in any suitable order, unless a specific order is clearly described or such order is indicated by the context. In some cases, two or more steps/operations may be performed substantially at the same time.

All the terms used herein, including technological or scientific terms, have the same meanings as are typically understood by those skilled in the art, unless otherwise defined. Terms defined in commonly used dictionaries should be construed in the context of the related technology and should not be construed as ideal or in an excessively formal way, unless clearly defined in the application.

Various embodiments of the present disclosure are directed to providing a group control circuit that has a parallel structure and can generate a plurality of activation selection signals that are sequentially activated.

Various embodiments of the present disclosure are directed to providing a semiconductor memory apparatus capable of sequentially activating a plurality of page buffer circuits or activating the plurality of page buffer circuits in a preset number of splits of activation points of the page buffer circuits.

FIG. 1 is a block diagram illustrating a configuration of a group control circuit 100 in accordance with an embodiment of the present disclosure.

Referring to FIG. 1, the group control circuit 100 has a parallel structure, and may be configured to generate a plurality of activation selection signals SEL1_1 to SEL1_N and SEL2_1 to SEL2_M (each of N and M is a natural number equal to or greater than 1) that are sequentially activated, on the basis of an entry control signal CTR_ET. In more detail, the group control circuit 100 may include a selection signal generation circuit 110, a first activation selection circuit 120, and a second activation selection circuit 130.

First, the selection signal generation circuit 110 may be configured to generate a source selection signal SEL_S by synchronizing the entry control signal CTR_ET with a clock signal. The entry control signal CTR_ET may be a pulse signal that is activated at an entry point to an activation control operation of the group control circuit 100.

For reference, the selection signal generation circuit 110 may use the clock signal, with which the entry control signal CTR_ET is synchronized. As will be shown in FIG. 3, the entry control signal CTR_ET may be synchronized with the clock signal such that the clock signal transitions while the entry control signal CTR_ET or the pulse signal is enabled.

For example, the clock signal may be a first edge clock signal CLK_OD or a second edge clock signal CLK_EV, which will be described below. For reference, in the present specification, as an example, the entry control signal CTR_ET is synchronized with the second edge clock signal CLK_EV.

Next, the first activation selection circuit 120 may be configured to generate a plurality of first activation selection signals SEL1_1 to SEL1_N that are sequentially activated by synchronizing the source selection signal SEL_S with the first edge clock signal CLK_OD.

Next, the second activation selection circuit 130 may be configured to generate a plurality of second activation selection signals SEL2_1 to SEL2_M that are sequentially activated by synchronizing the source selection signal SEL_S with the second edge clock signal CLK_EV.

The first activation selection circuit 120 and the second activation selection circuit 130 may have a parallel structure of receiving the source selection signal SEL_S, respectively. Furthermore, the first edge clock signal CLK_OD and the second edge clock signal CLK_EV may have different phases. For example, the first edge clock signal CLK_OD and the second edge clock signal CLK_EV may have a phase difference of 180°. That is, the phase of the first edge clock signal CLK_OD and the phase of the second edge clock signal CLK_EV may be in an inverse relationship.

Figure 2:
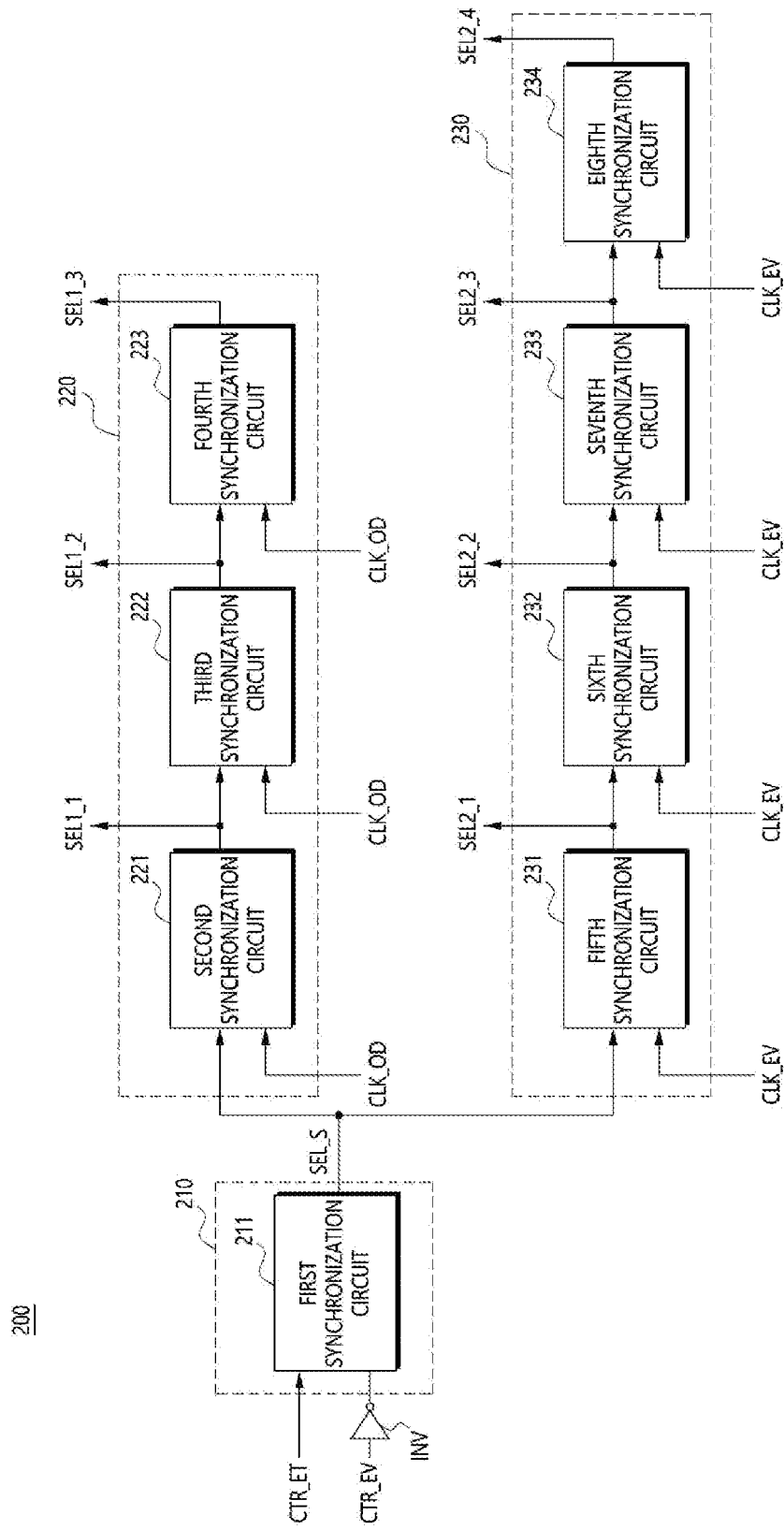
FIG. 2 is a block diagram illustrating a configuration of a group control circuit in accordance with an embodiment of the present disclosure.

FIG. 2 is a block diagram illustrating a configuration of a group control circuit 200 in accordance with an embodiment of the present disclosure.

Referring to FIG. 2, the group control circuit 200 may include a selection signal generation circuit 210, a first activation selection circuit 220, and a second activation selection circuit 230. The selection signal generation circuit 210, the first activation selection circuit 220, and the second activation selection circuit 230 may correspond to the selection signal generation circuit 110, the first activation selection circuit 120, and the second activation selection circuit 130 in FIG. 1, respectively.

First, the selection signal generation circuit 210 may include a first synchronization circuit 211.

The first synchronization circuit 211 may be configured to output the source selection signal SEL_S through a synchronization operation on the entry control signal CTR_ET on the basis of the second edge clock signal CLK_EV. The second edge clock signal CLK_EV may be inverted by an inverting circuit INV and inputted to the first synchronization circuit 211. The first synchronization circuit 211 may be composed of, for example, a D flip-flop capable of performing a synchronization operation on the basis of an output signal of the inverting circuit INV.

Next, the first activation selection circuit 220 may be configured to generate a plurality of first activation selection signals through a shifting operation on the source selection signal SEL_S on the basis of the first edge clock signal CLK_OD. As an example, the number of the plurality of first activation selection signals is, for example, three. That is, the first activation selection circuit 220 may generate first to third activation selection signals SEL1_1 to SEL1_3 through the shifting operation on the source selection signal SEL_S on the basis of the first edge clock signal CLK_OD.

In more detail, the first activation selection circuit 220 may include second to fourth synchronization circuits 221 to 223. The second synchronization circuit 221 may output the first activation selection signal SEL1_1 by synchronizing the source selection signal SEL_S with the first edge clock signal CLK_OD. The third synchronization circuit 222 may output the second activation selection signal SEL1_2 by synchronizing the first activation selection signal SEL1_1 with the first edge clock signal CLK_OD. The fourth synchronization circuit 223 may output the third activation selection signal SEL1_3 by synchronizing the second activation selection signal SEL1_2 with the first edge clock signal CLK_OD. The second to fourth synchronization circuits 221 to 223 may each be comprised of, for example, a D flip-flop capable of performing a synchronization operation on the basis of the first edge clock signal CLK_OD.

Next, the second activation selection circuit 230 may be configured to generate a plurality of second activation selection signals through a shifting operation on the source selection signal SEL_S on the basis of the second edge clock signal CLK_EV. As an example, the number of the plurality of second activation selection signals is, for example, four. That is, the second activation selection circuit 230 may generate fourth to seventh activation selection signals SEL2_1 to SEL2_4 through the shifting operation on the source selection signal SEL_S on the basis of the second edge clock signal CLK_EV.

In more detail, the second activation selection circuit 230 may include fifth to eighth synchronization circuits 231 to 234. The fifth synchronization circuit 231 may output the fourth activation selection signal SEL2_1 by synchronizing the source selection signal SEL_S with the second edge clock signal CLK_EV. The sixth synchronization circuit 232 may output the fifth activation selection signal SEL2_2 by synchronizing the fourth activation selection signal SEL2_1 with the second edge clock signal CLK_EV. The seventh synchronization circuit 233 may output the sixth activation selection signal SEL2_3 by synchronizing the fifth activation selection signal SEL2_2 with the second edge clock signal CLK_EV. The eighth synchronization circuit 234 may output the seventh activation selection signal SEL2_4 by synchronizing the sixth activation selection signal SEL2_3 with the second edge clock signal CLK_EV. The fifth to eighth synchronization circuits 231 to 234 may each be comprised of, for example, a D flip-flop capable of performing a synchronization operation on the basis of the second edge clock signal CLK_EV.

Figure 3:
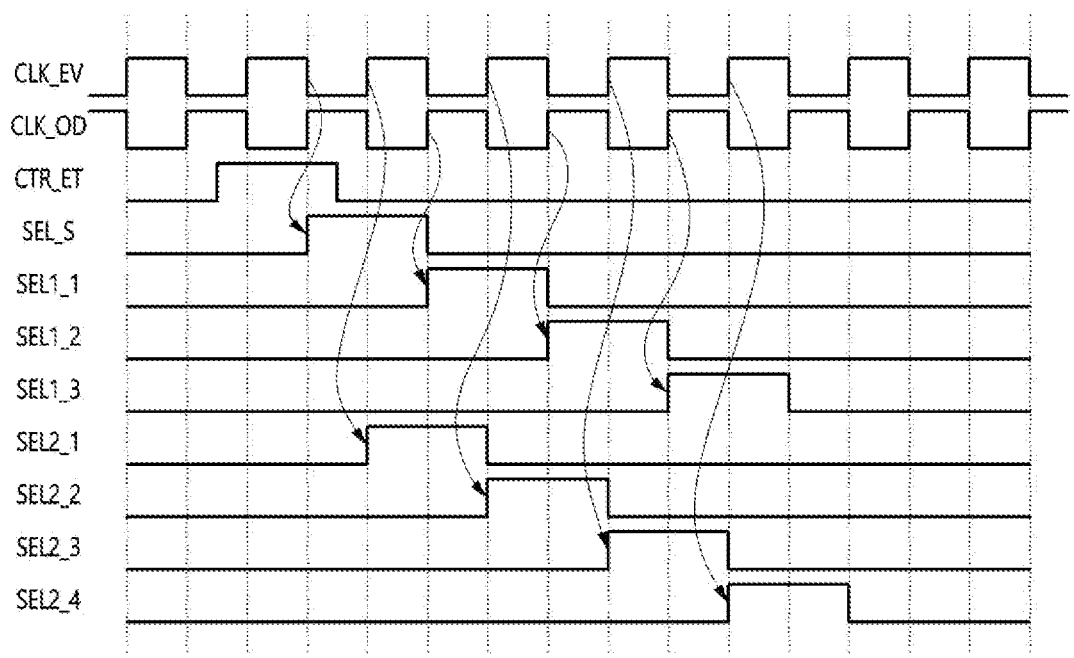
FIG. 3 is a waveform diagram illustrating a circuit operation of the group control circuit in FIG. 2 in accordance with an embodiment of the present disclosure.

FIG. 3 is a waveform diagram illustrating a circuit operation of the group control circuit 200 in FIG. 2. FIG. 3 illustrates the first edge clock signal CLK_OD, the second edge clock signal CLK_EV, the entry control signal CTR_ET, the first to third and the fourth to seventh activation selection signals SEL1_1 to SEL1_3 and SEL2_1 to SEL2_4.

Hereinafter, for convenience of description, the circuit operation of the group control circuit 200 will be described with reference to FIG. 2 and FIG. 3.

First, the first edge clock signal CLK_OD and the second edge clock signal CLK_EV may be clock signals having phases opposite to each other. The first synchronization circuit 211 of the selection signal generation circuit 210 in FIG. 2 may generate the source selection signal SEL_S by synchronizing the entry control signal CTR_ET with the second edge clock signal CLK_EV. At this time, the second edge clock signal CLK_EV may be inverted by the inverting circuit INV and inputted to the first synchronization circuit 211. Accordingly, the entry control signal CTR_ET may be outputted as the source selection signal SEL_S in synchronization with a falling edge of the second edge clock signal CLK_EV.

Next, the second synchronization circuit 221 in FIG. 2 may generate the first activation selection signal SEL1_1 by synchronizing the source selection signal SEL_S with the first edge clock signal CLK_OD. At this time, the second synchronization circuit 221 may perform a synchronization operation on the basis of a rising edge of the first edge clock signal CLK_OD. Accordingly, the source selection signal SEL_S may be outputted as the first activation selection signal SEL1_1 in synchronization with the rising edge of the first edge clock signal CLK_OD. Subsequently, the third synchronization circuit 222 may output the second activation selection signal SEL1_2 by synchronizing the first activation selection signal SEL1_1 with the rising edge of the first edge clock signal CLK_OD. Then, the fourth synchronization circuit 223 may output the third activation selection signal SEL1_3 by synchronizing the second activation selection signal SEL1_2 with the rising edge of the first edge clock signal CLK_OD.

That is, the first activation selection circuit 220 including the second to fourth synchronization circuits 221 to 223 may shift the source selection signal SEL_S in synchronization with the first edge clock signal CLK_OD. That is, the first activation selection circuit 220 may generate the first to third activation selection signals SEL1_1 to SEL1_3 that are sequentially activated through a shifting operation on the source selection signal SEL_S on the basis of the first edge clock signal CLK_OD.

Next, the fifth synchronization circuit 231 in FIG. 2 may generate the fourth activation selection signal SEL2_1 by synchronizing the source selection signal SEL_S with the second edge clock signal CLK_EV. At this time, the fifth synchronization circuit 231 may perform a synchronization operation on the basis of a rising edge of the second edge clock signal CLK_EV. Accordingly, the source selection signal SEL_S may be outputted as the fourth activation selection signal SEL2_1 in synchronization with the rising edge of the second edge clock signal CLK_EV. Subsequently, the sixth synchronization circuit 232 may output the fifth activation selection signal SEL2_2 by synchronizing the fourth activation selection signal SEL2_1 with the rising edge of the second edge clock signal CLK_EV. Then, the seventh synchronization circuit 233 may output the sixth activation selection signal SEL2_3 by synchronizing the fifth activation selection signal SEL2_2 with the rising edge of the second edge clock signal CLK_EV. Then, the eighth synchronization circuit 234 may output the seventh activation selection signal SEL2_4 by synchronizing the sixth activation selection signal SEL2_3 with the rising edge of the second edge clock signal CLK_EV.

The second activation selection circuit 230 including the fifth to eighth synchronization circuits 231 to 234 may shift the source selection signal SEL_S in synchronization with the second edge clock signal CLK_EV. That is, the second activation selection circuit 230 may generate the fourth to seventh activation selection signals SEL2_1 to SEL2_4 that are sequentially activated through a shifting operation on the source selection signal SEL_S on the basis of the second edge clock signal CLK_EV.

Hereinafter, for convenience of description and as an example, the first edge clock signal CLK_OD and the second edge clock signal CLK_EV each have a period of 100 ns. In such a case, an activation interval, at which each of the first to third activation selection signals SEL1_1 to SEL1_3 transitions from logic 'low' to logic 'high', may be 100 ns. Furthermore, an activation interval, at which each of the fourth to seventh activation selection signals SEL2_1 to SEL2_4 transitions from logic 'low' to logic 'high', may also be 100 ns. Accordingly, as can be seen from FIG. 3, the activation interval of each of the first to third activation selection signals SEL1_1 to SEL1_3, which are the plurality of first activation selection signals, and the activation interval of each of the fourth to seventh activation selection signals SEL2_1 to SEL2_4, which are the plurality of second activation selection signals, may each be 50 ns.

Therefore, the group control circuit 200 in accordance with an embodiment has a parallel structure, and may generate the first to third and the fourth to seventh activation selection signals SEL1_1 to SEL1_3 and SEL2_1 to SEL2_4, which are sequentially activated.

Figure 4:
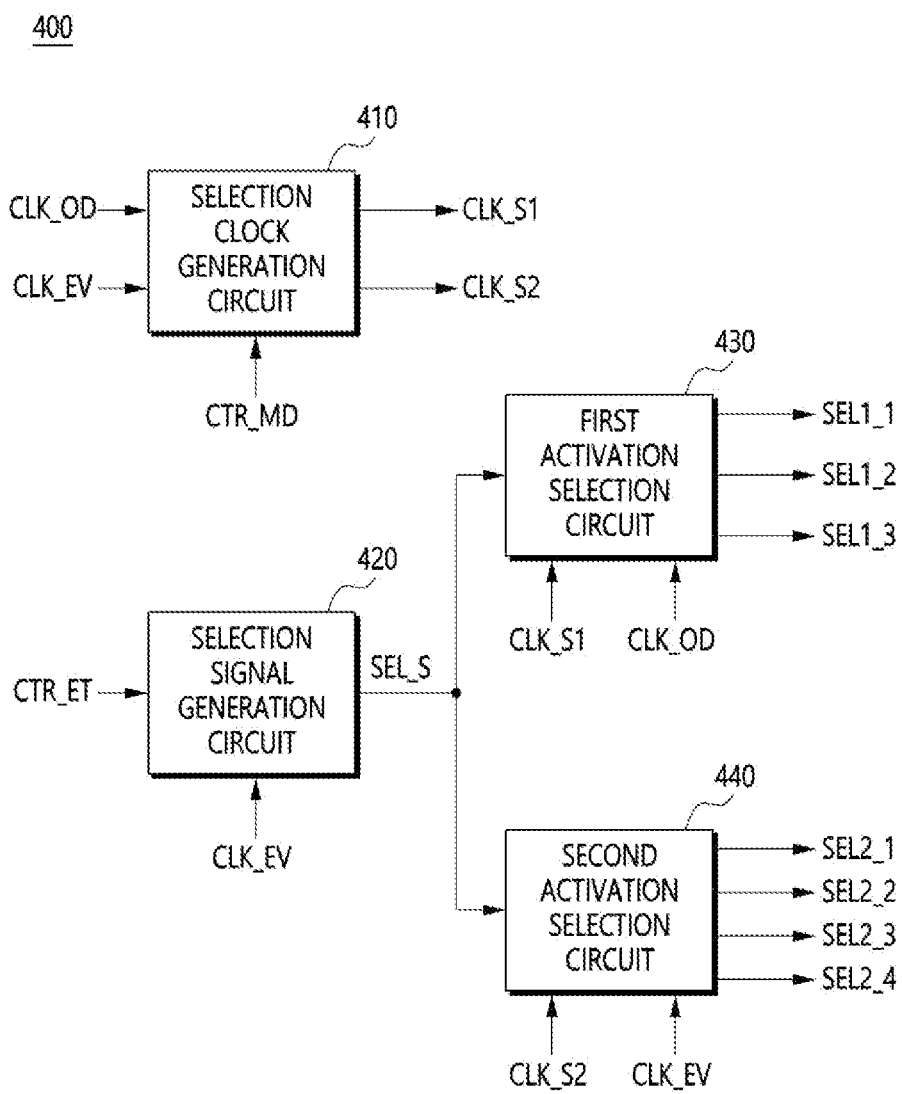
FIG. 4 is a block diagram illustrating a configuration of a group control circuit in accordance with an embodiment of the present disclosure.

FIG. 4 is a block diagram illustrating a configuration of a group control circuit 400 in accordance with an embodiment of the present disclosure.

Referring to FIG. 4, the group control circuit 400 may include a selection clock generation circuit 410, a selection signal generation circuit 420, a first activation selection circuit 430, and a second activation selection circuit 440.

Before the configuration of the group control circuit 400 is described, the group control circuit 400 may generate a plurality of first and second activation selection signals SEL1_1 to SEL1_N and SEL2_1 to SEL2_M as in FIG. 1. However, in FIG. 4, as an example, the number of the plurality of first activation selection signals is three and the number of the plurality of second activation selection signals is four as in FIG. 2. That is, the group control circuit 400 in FIG. 4 may generate the first to third and the fourth to seventh activation selection signals SEL1_1 to SEL1_3 and SEL2_1 to SEL2_4.

First, the selection clock generation circuit 410 may be configured to generate first and second selection clock signals CLK_S1 and CLK_S2 respectively from the first and second edge clock signals CLK_OD and CLK_EV or vice versa, on the basis of a mode control signal CTR_MD. The mode control signal CTR_MD may be a signal for controlling splitting of the activation of the first to third and the fourth to seventh activation selection signals SEL1_1 to SEL1_3 and SEL2_1 to SEL2_4.

In more detail, in FIG. 3, activation points of the first to third and the fourth to seventh activation selection signals SEL1_1 to SEL1_3 and SEL2_1 to SEL2_4 may be different from one another. That is, the first to third and the fourth to seventh activation selection signals SEL1_1 to SEL1_3 and SEL2_1 to SEL2_4 may split activation points for a plurality of internal circuits into seven. As will be described below, the first to third and the fourth to seventh activation selection signals SEL1_1 to SEL1_3 and SEL2_1 to SEL2_4 may split the activation points for the plurality of internal circuits into a number less than seven (for example, four) and control the split activation points.

Hereinafter, for convenience of description, a mode, in which the activation points are split into seven, is defined as a '7-split operation mode', and a mode, in which the activation points are split into four, is defined as a '4-split operation mode'. The group control circuit 400 in accordance with an embodiment may control the first to third and the fourth to seventh activation selection signals SEL1_1 to SEL1_3 and SEL2_1 to SEL2_4 in the 7-split operation mode or the 4-split operation mode on the basis of the mode control signal CTR_MD. That is, the mode control signal CTR_MD may be a signal for controlling a split operation mode for the first to third and the fourth to seventh activation selection signals SEL1_1 to SEL1_3 and SEL2_1 to SEL2_4.

Next, the selection signal generation circuit 420 may be configured to generate the source selection signal SEL_S by synchronizing the entry control signal CTR_ET with the second edge clock signal CLK_EV. The selection signal generation circuit 420 may correspond to the selection signal generation circuit 210 in FIG. 2. Accordingly, the selection signal generation circuit 420 in FIG. 4 may generate the source selection signal SEL_S through a synchronization operation on the entry control signal CTR_ET on the basis of the second edge clock signal CLK_EV.

Next, the first activation selection circuit 430 may be configured to generate the first to third activation selection signals SEL1_1 to SEL1_3 that are sequentially activated by alternately synchronizing the source selection signal SEL_S with the first edge clock signal CLK_OD and the first selection clock signal CLK_S1.

Next, the second activation selection circuit 440 may be configured to generate the fourth to seventh activation selection signals SEL2_1 to SEL2_4 that are sequentially activated by alternately synchronizing the source selection signal SEL_S with the second edge clock signal CLK_EV and the second selection clock signal CLK_S2.

As will be described below, the group control circuit 400 in accordance with an embodiment may generate the first and second selection clock signals CLK_S1 and CLK_S2 on the basis of the mode control signal CTR_MD. Furthermore, the group control circuit 400 may selectively control the 7-split operation mode and the 4-split operation mode on the basis of the first and second selection clock signals CLK_S1 and CLK_S2.

Figure 5:
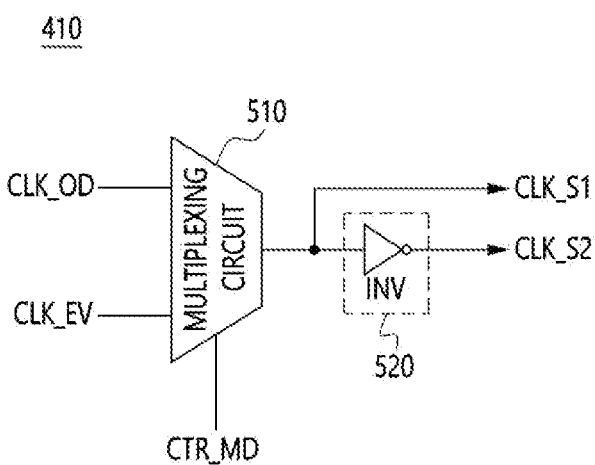
FIG. 5 is a diagram illustrating a configuration of a selection clock generation circuit in FIG. 4 in accordance with an embodiment of the present disclosure.

FIG. 5 is a diagram illustrating a configuration of the selection clock generation circuit 410 in FIG. 4 in accordance with an embodiment of the present disclosure.

Referring to FIG. 5, the selection clock generation circuit 410 may include a multiplexing circuit 510 and an inversion circuit 520.

First, the multiplexing circuit 510 may be configured to output the first edge clock signal CLK_OD or the second edge clock signal CLK_EV as the first selection clock signal CLK_S1 on the basis of the mode control signal CTR_MD. The multiplexing circuit 510 may be comprised of, for example, a multiplexer MUX.

Next, the inversion circuit 520 may be configured to output the second selection clock signal CLK_S2 by inverting the first selection clock signal CLK_S1. The inversion circuit 520 may be comprised of an inverting circuit INV that receives and inverts the first selection clock signal CLK_S1 and outputs the inverted signal as the second selection clock signal CLK_S2.

Figure 6:
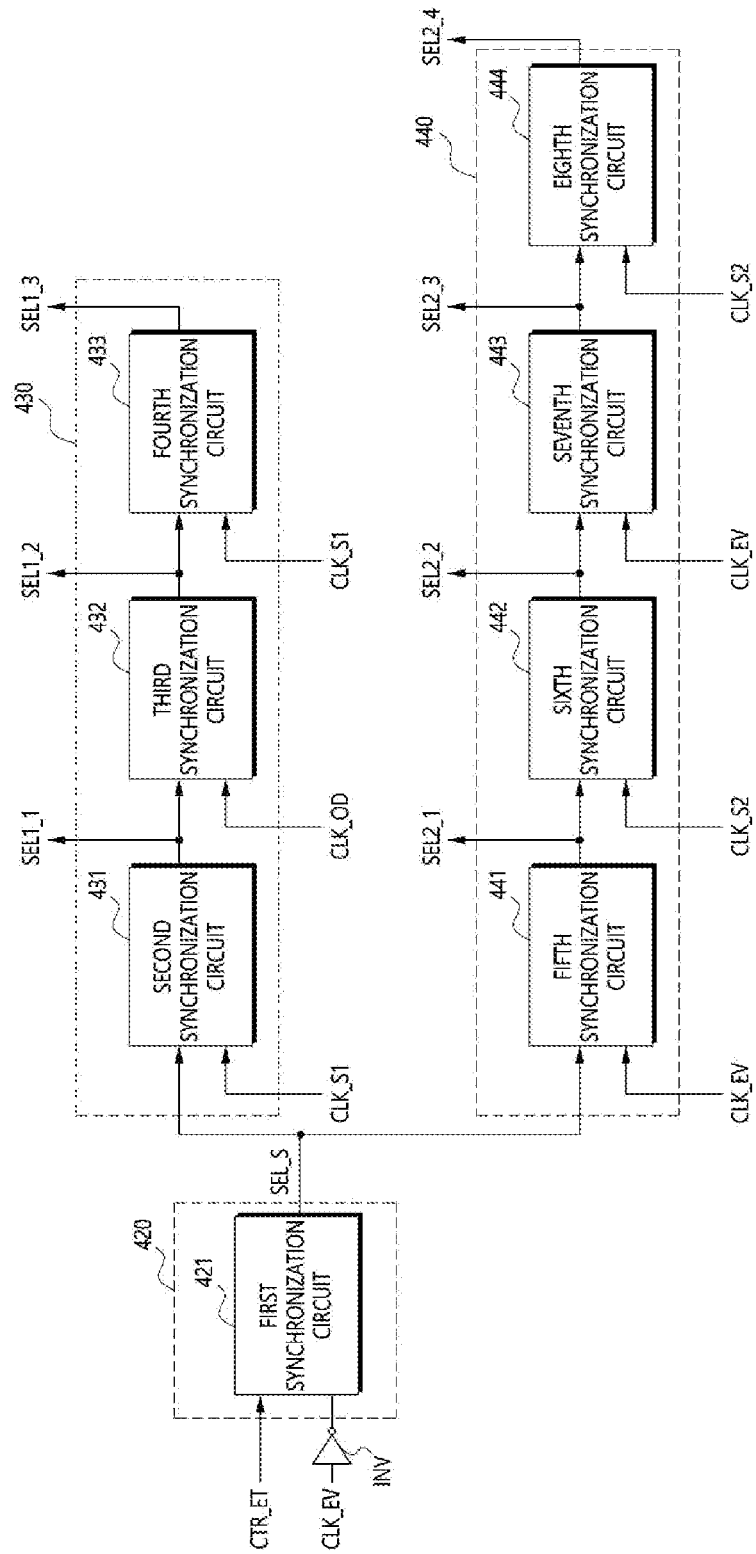
FIG. 6 is a block diagram illustrating configurations of a selection signal generation circuit and first and second activation selection circuits in FIG. 4 in accordance with an embodiment of the present disclosure.

FIG. 6 is a block diagram illustrating configurations of the selection signal generation circuit 420 and the first and second activation selection circuits 430 and 440 in FIG. 4 in accordance with an embodiment of the present disclosure.

Referring to FIG. 6, the selection signal generation circuit 420 may include a first synchronization circuit 421.

The first synchronization circuit 421 may be configured to output the source selection signal SEL_S through a synchronization operation on the entry control signal CTR_ET on the basis of the second edge clock signal CLK_EV. The second edge clock signal CLK_EV may be inverted by the inverting circuit INV and inputted to the first synchronization circuit 421.

Next, the first activation selection circuit 430 may be configured to generate a plurality of first activation selection signals through a shifting operation on the source selection signal SEL_S on the basis of the first edge clock signal CLK_OD and the first selection clock signal CLK_S1. The plurality of first activation selection signals may include the first to third activation selection signals SEL1_1 to SEL1_3.

In more detail, the first activation selection circuit 430 may include second to fourth synchronization circuits 431 to 433 which are a plurality of activation circuits. The second synchronization circuit 431 may output the first activation selection signal SEL1_1 by synchronizing the source selection signal SEL_S with the first selection clock signal CLK_S1. The third synchronization circuit 432 may output the second activation selection signal SEL1_2 by synchronizing the first activation selection signal SEL1_1 with the first edge clock signal CLK_OD. The fourth synchronization circuit 433 may output the third activation selection signal SEL1_3 by synchronizing the second activation selection signal SEL1_2 with the first selection clock signal CLK_S1.

Next, the second activation selection circuit 440 may be configured to generate a plurality of second activation selection signals through a shifting operation on the source selection signal SEL_S on the basis of the second edge clock signal CLK_EV and the second selection clock signal CLK_S2. The plurality of second activation selection signals may include the fourth to seventh activation selection signals SEL2_1 to SEL2_4.

In more detail, the second activation selection circuit 440 may include fifth to eighth synchronization circuits 441 to 444. The fifth synchronization circuit 441 may output the fourth activation selection signal SEL2_1 by synchronizing the source selection signal SEL_S with the second edge clock signal CLK_EV. The sixth synchronization circuit 442 may output the fifth activation selection signal SEL2_2 by synchronizing the fourth activation selection signal SEL2_1 with the second selection clock signal CLK_S2. The seventh synchronization circuit 443 may output the sixth activation selection signal SEL2_3 by synchronizing the fifth activation selection signal SEL2_2 with the second edge clock signal CLK_EV. The eighth synchronization circuit 444 may output the seventh activation selection signal SEL2_4 by synchronizing the sixth activation selection signal SEL2_3 with the second selection clock signal CLK_S2.

Hereinafter, the 7-split operation mode and the 4-split operation mode of the group control circuit 400 in FIG. 4 in accordance with an embodiment will be described.

First, the 7-split operation mode will be described.

Referring to FIG. 4, on the basis of the mode control signal CTR_MD, the selection clock generation circuit 410 may generate the first selection clock signal CLK_S1 corresponding to the first edge clock signal CLK_OD and the second selection clock signal CLK_S2 corresponding to the second edge clock signal CLK_EV. As can be seen from FIG. 5, in the 7-split operation mode, the multiplexing circuit 510 of the selection clock generation circuit 410 may output the first edge clock signal CLK_OD as the first selection clock signal CLK_S1 on the basis of the mode control signal CTR_MD. Accordingly, the first selection clock signal CLK_S1 may correspond to the first edge clock signal CLK_OD and the second selection clock signal CLK_S2 may correspond to the second edge clock signal CLK_EV.

Therefore, the second to fourth synchronization circuits 431 to 433 in FIG. 6 may perform a shifting operation on the basis of the first edge clock signal CLK_OD, similar to the second to fourth synchronization circuits 221 to 223 in FIG. 2. Furthermore, the fifth to eighth synchronization circuits 441 to 444 may perform a shifting operation on the basis of the second edge clock signal CLK_EV, similar to the fifth to eighth synchronization circuits 231 to 234 in FIG. 2.

Accordingly, the first to third activation selection signals SEL1_1 to SEL1_3, which are the plurality of first activation selection signals outputted from the second to fourth synchronization circuits 431 to 433, may be sequentially activated as illustrated in FIG. 3. Furthermore, the fourth to seventh activation selection signals SEL2_1 to SEL2_4, which are the plurality of second activation selection signals outputted from the fifth to eighth synchronization circuits 441 to 444, may also be sequentially activated as illustrated in FIG. 3.

Therefore, the group control circuit 400 in accordance with an embodiment may generate the first to third and the fourth to seventh activation selection signals SEL1_1 to SEL1_3 and SEL2_1 to SEL2_4, whose seven transition points are sequentially activated, on the basis of the mode control signal CTR_MD. Furthermore, the group control circuit 400 may control the 7-split operation mode for the plurality of internal circuits through the first to third and the fourth to seventh activation selection signals SEL1_1 to SEL1_3 and SEL2_1 to SEL2_4.

Next, the 4-split operation mode will be described.

Referring to FIG. 4, on the basis of the mode control signal CTR_MD, the selection clock generation circuit 410 may generate the first selection clock signal CLK_S1 corresponding to the second edge clock signal CLK_EV and the second selection clock signal CLK_S2 corresponding to the first edge clock signal CLK_OD. As can be seen from FIG. 5, in the 4-split operation mode, the multiplexing circuit 510 of the selection clock generation circuit 410 may output the second edge clock signal CLK_EV as the first selection clock signal CLK_S1 on the basis of the mode control signal CTR_MD. Accordingly, the first selection clock signal CLK_S1 may correspond to the second edge clock signal CLK_EV and the second selection clock signal CLK_S2 may correspond to the first edge clock signal CLK_OD.

Therefore, the second and fourth synchronization circuits 431 and 433 in FIG. 6 may receive the first selection clock signal CLK_S1 corresponding to the second edge clock signal CLK_EV and perform an activation operation, and the third synchronization circuit 432 may receive the first edge clock signal CLK_OD and perform a synchronization operation. Furthermore, the fifth and seventh synchronization circuits 441 and 443 may receive the second edge clock signal CLK_EV and perform a synchronization operation, and the sixth and eighth synchronization circuits 442 and 444 may receive the second selection clock signal CLK_S2 corresponding to the first edge clock signal CLK_OD and perform a synchronization operation.

Figure 7:
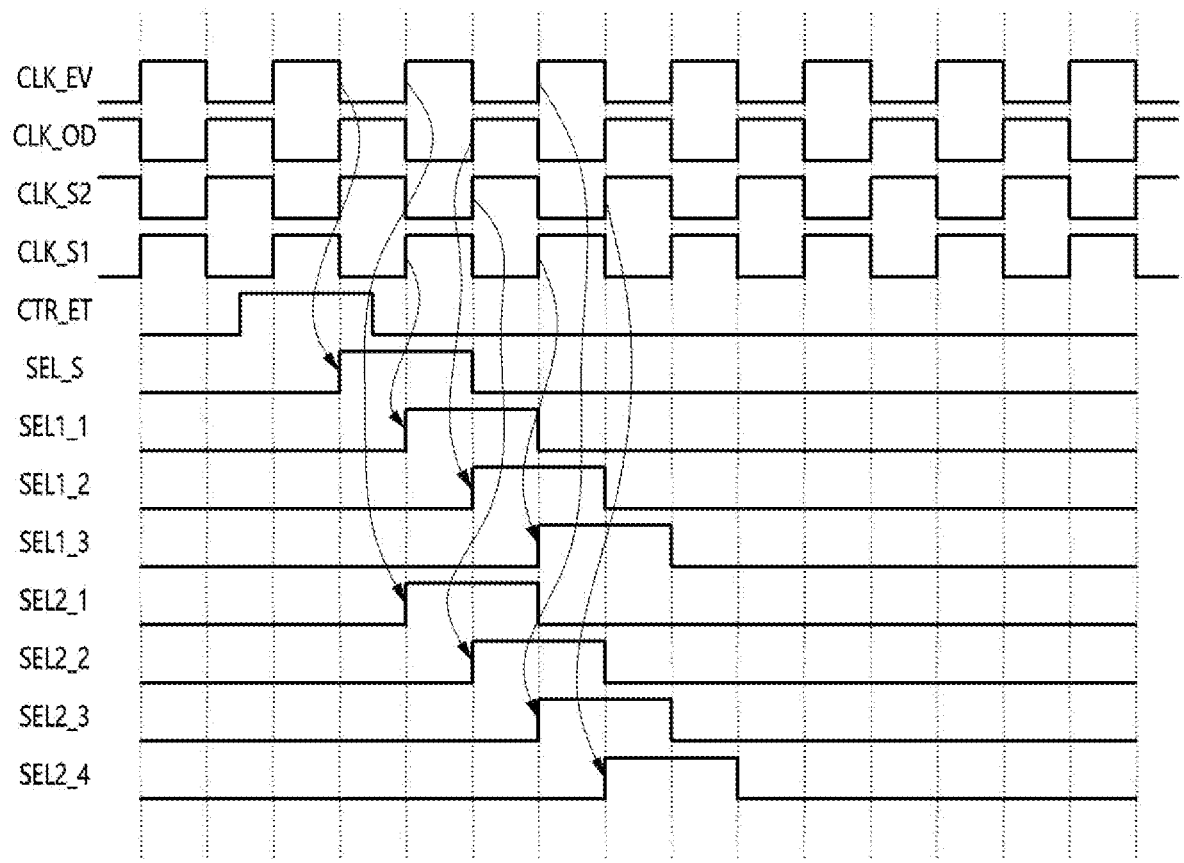
FIG. 7 is a waveform diagram illustrating a 4-split operation mode of the group control circuit in FIG. 4 in accordance with an embodiment of the present disclosure.

FIG. 7 is a waveform diagram illustrating the 4-split operation mode of the group control circuit 400 in FIG. 4 in accordance with an embodiment of the present disclosure. FIG. 7 illustrates the first edge clock signal CLK_OD, the second edge clock signal CLK_EV, the entry control signal CTR_ET, and the first to third and the fourth to seventh activation selection signals SEL1_1 to SEL1_3 and SEL2_1 to SEL2_4.

Hereinafter, for convenience of description, the 4-split operation mode of the group control circuit 400 will be described with reference to FIG. 6 and FIG. 7.

First, the first edge clock signal CLK_OD and the second edge clock signal CLK_EV may be clock signals having phases opposite to each other. The first synchronization circuit 421 of the selection signal generation circuit 420 in FIG. 6 may generate the source selection signal SEL_S by synchronizing the entry control signal CTR_ET with the second edge clock signal CLK_EV. At this time, the second edge clock signal CLK_EV may be inverted by the inverting circuit INV and inputted to the first synchronization circuit 421. Accordingly, the entry control signal CTR_ET may be outputted as the source selection signal SEL_S in synchronization with a falling edge of the second edge clock signal CLK_EV.

Next, the second synchronization circuit 431 in FIG. 6 may generate the first activation selection signal SEL1_1 by synchronizing the source selection signal SEL_S with the first selection clock signal CLK_S1 corresponding to the second edge clock signal CLK_EV. At this time, the second synchronization circuit 431 may perform a synchronization operation on the basis of a rising edge of the first selection clock signal CLK_S1. Accordingly, the source selection signal SEL_S may be outputted as the first activation selection signal SEL1_1 in synchronization with the rising edge of the first selection clock signal CLK_S1. Subsequently, the third synchronization circuit 432 may output the second activation selection signal SEL1_2 by synchronizing the first activation selection signal SEL1_1 with a rising edge of the first edge clock signal CLK_OD. Then, the fourth synchronization circuit 433 may output the third activation selection signal SEL1_3 by synchronizing the second activation selection signal SEL1_2 with the rising edge of the first selection clock signal CLK_S1.

The first activation selection circuit 430 including the second to fourth synchronization circuits 431 to 433 may shift the source selection signal SEL_S by alternately synchronizing the source selection signal SEL_S with the first edge clock signal CLK_OD and the first selection clock signal CLK_S1. That is, the first activation selection circuit 430 may generate the first to third activation selection signals SEL1_1 to SEL1_3 that are sequentially activated through a shifting operation on the source selection signal SEL_S on the basis of the first edge clock signal CLK_OD and the first selection clock signal CLK_S1.

Next, the fifth synchronization circuit 441 in FIG. 6 may generate the fourth activation selection signal SEL2_1 by synchronizing the source selection signal SEL_S with the second edge clock signal CLK_EV. At this time, the fifth synchronization circuit 441 may perform a synchronization operation on the basis of a rising edge of the second edge clock signal CLK_EV. Accordingly, the source selection signal SEL_S may be outputted as the fourth activation selection signal SEL2_1 in synchronization with the rising edge of the second edge clock signal CLK_EV. Subsequently, the sixth synchronization circuit 442 may output the fifth activation selection signal SEL2_2 by synchronizing the fourth activation selection signal SEL2_1 with a rising edge of the second selection clock signal CLK_S2 corresponding to the first edge clock signal CLK_OD. Then, the seventh synchronization circuit 443 may output the sixth activation selection signal SEL2_3 by synchronizing the fifth activation selection signal SEL2_2 with the rising edge of the second edge clock signal CLK_EV. Then, the eighth synchronization circuit 444 may output the seventh activation selection signal SEL2_4 by synchronizing the sixth activation selection signal SEL2_3 with the rising edge of the second selection clock signal CLK_S2.

The second activation selection circuit 440 including the fifth to eighth synchronization circuits 441 to 444 may shift the source selection signal SEL_S by alternately synchronizing the source selection signal SEL_S with the second edge clock signal CLK_EV and the second selection clock signal CLK_S2. That is, the second activation selection circuit 440 may generate the fourth to seventh activation selection signals SEL2_1 to SEL2_4 that are sequentially activated through a shifting operation on the source selection signal SEL_S on the basis of the second edge clock signal CLK_EV and the second selection clock signal CLK_S2.

Hereinafter, for convenience of description, the first edge clock signal CLK_OD and the second edge clock signal CLK_EV each have a period of 100 ns. In such a case, an interval, at which each of the first to third activation selection signals SEL1_1 to SEL1_3 transitions from logic 'low' to logic 'high', may be 50 ns. Furthermore, an activation interval, at which each of the fourth to seventh activation selection signals SEL2_1 to SEL2_4 transitions from logic 'low' to logic 'high', may also be 50 ns. As this time, the first activation selection signal SEL1_1 and the fourth activation selection signal SEL2_1 may have substantially the same transition point, the second activation selection signal SEL1_2 and the fifth activation selection signal SEL2_2 may have substantially the same transition point, and the third activation selection signal SEL1_3 and the sixth activation selection signal SEL2_3 may have substantially the same transition point. That is, the first to third and the fourth to seventh activation selection signals SEL1_1 to SEL1_3 and SEL2_1 to SEL2_4 may have four transition points.

Therefore, the group control circuit 400 in accordance with an embodiment may generate the first to third and the fourth to seventh activation selection signals SEL1_1 to SEL1_3 and SEL2_1 to SEL2_4, whose four transition points are sequentially activated, on the basis of the mode control signal CTR_MD. Furthermore, the group control circuit 400 may control the 4-split operation mode for the plurality of internal circuits through the first to third and the fourth to seventh activation selection signals SEL1_1 to SEL1_3 and SEL2_1 to SEL2_4.

As can be seen from FIG. 3 and FIG. 7, the source selection signal SEL_S may be a signal that is first activated among the first to third and the fourth to seventh activation selection signals SEL1_1 to SEL1_3 and SEL2_1 to SEL2_4. Furthermore, the source selection signal SEL_S may be a signal synchronized with the second edge clock signal CLK_EV. Accordingly, the source selection signal SEL_S may be used for a split operation on the plurality of internal circuits, similar to the first to third and the fourth to seventh activation selection signals SEL1_1 to SEL1_3 and SEL2_1 to SEL2_4.

In more detail, as can be seen from FIG. 3, the source selection signal SEL_S and the first to third and the fourth to seventh activation selection signals SEL1_1 to SEL1_3 and SEL2_1 to SEL2_4 may be sequentially activated at eight transition points. Accordingly, the group control circuit 400 in FIG. 4 may control an 8-split operation mode for the plurality of internal circuits through the source selection signal SEL_S and the first to third and the fourth to seventh activation selection signals SEL1_1 to SEL1_3 and SEL2_1 to SEL2_4.

Subsequently, as can be seen from FIG. 7, the source selection signal SEL_S and the first to third and the fourth to seventh activation selection signals SEL1_1 to SEL1_3 and SEL2_1 to SEL2_4 may be sequentially activated at five transition points. Accordingly, the group control circuit 400 in FIG. 4 may control a 5-split operation mode for the plurality of internal circuits through the source selection signal SEL_S and the first to third and the fourth to seventh activation selection signals SEL1_1 to SEL1_3 and SEL2_1 to SEL2_4.

The group control circuit 100 in FIG. 1 in accordance with an embodiment may adjust respective activation intervals of the source selection signal SEL_S and the plurality of first and second activation selection signals SEL1_1 to SEL1_N and SEL2_1 to SEL2_M. Furthermore, the group control circuit 400 in FIG. 4 in accordance with an embodiment may adjust respective activation intervals of the source selection signal SEL_S and the first to third and the fourth to seventh activation selection signals SEL1_1 to SEL1_3 and SEL2_1 to SEL2_4. The group control circuit in accordance with an embodiment may further include an interval control circuit for adjusting the activation interval. The interval control circuit will be described with reference to FIG. 8.

Figure 8:
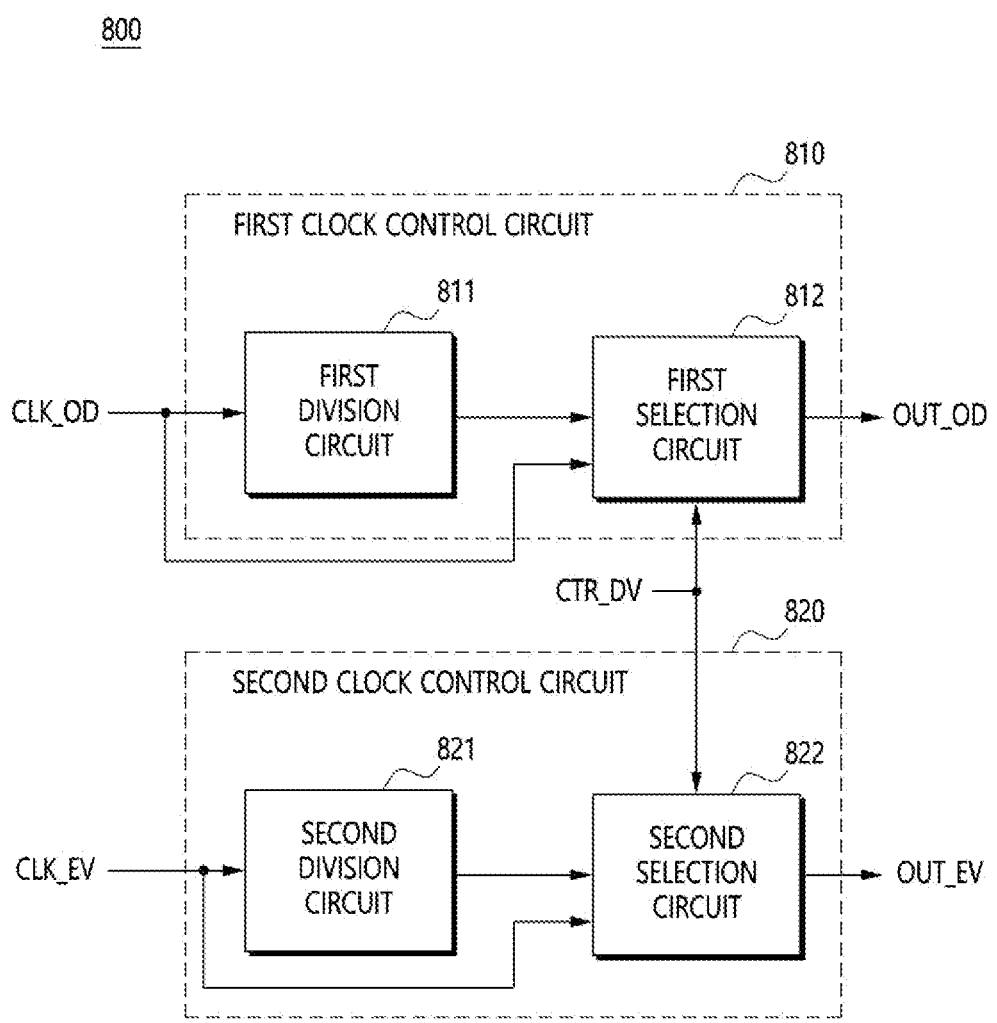
FIG. 8 is a block diagram illustrating a configuration of an interval control circuit in accordance with an embodiment of the present disclosure.

FIG. 8 is a block diagram illustrating a configuration of an interval control circuit 800 in accordance with an embodiment of the present disclosure.

Referring to FIG. 8, the interval control circuit 800 may include a first clock control circuit 810 and a second clock control circuit 820.

First, the first clock control circuit 810 may be configured to output the first edge clock signal CLK_OD as is or divide and output the first edge clock signal CLK_OD on the basis of a division control signal CTR_DV. Here, the division may mean that the period of the first edge clock signal CLK_OD is adjusted to be, for example, twice, or for example, 0.5 times. That is, the first clock control circuit 810 may be configured to adjust the period of the first edge clock signal CLK_OD on the basis of the division control signal CTR_DV. In more detail, the first clock control circuit 810 may include a first division circuit 811 and a first selection circuit 812.

The first division circuit 811 may be configured to divide and output the first edge clock signal CLK_OD. That is, the first division circuit 811 may be configured to change the first edge clock signal CLK_OD to have a different period from the original one. The first selection circuit 812 may be configured to selectively output an output signal of the first division circuit 811 or the first edge clock signal CLK_OD on the basis of the division control signal CTR_DV. An output signal OUT_OD of the first selection circuit 812 may be provided as the first edge clock signal CLK_OD of the group control circuit 100 in FIG. 1, and may be provided as the first edge clock signal CLK_OD of the group control circuit 400 in FIG. 4.

Next, the second clock control circuit 820 may be configured to output the second edge clock signal CLK_EV as is or divide and output the second edge clock signal CLK_EV on the basis of the division control signal CTR_DV. That is, the second clock control circuit 820 may be configured to adjust a period of the second edge clock signal CLK_EV on the basis of the division control signal CTR_DV. In more detail, the second clock control circuit 820 may include a second division circuit 821 and a second selection circuit 822.

The second division circuit 821 may be configured to divide and output the second edge clock signal CLK_EV. That is, the second division circuit 821 may be configured to change the second edge clock signal CLK_EV to have a different period from the original one. The second selection circuit 822 may be configured to selectively output an output signal of the second division circuit 821 or the second edge clock signal CLK_EV on the basis of the division control signal CTR_DV. An output signal OUT_EV of the second selection circuit 822 may be provided as the second edge clock signal CLK_EV of the group control circuit 100 in FIG. 1, and may be provided as the second edge clock signal CLK_EV of the group control circuit 400 in FIG. 4.

In FIG. 4, the mode control signal CTR_MD may be used as a control signal for controlling the split operation mode. Furthermore, in FIG. 8, the division control signal CTR_DV may be used as a control signal for controlling whether to perform a division operation of adjusting the periods of the first and second edge clock signals CLK_OD and CLK_EV. The group control circuit 400 in accordance with an embodiment may simultaneously control the split operation mode of FIG. 4 and whether to perform the division operation of FIG.

8, by using the mode control signal CTR_MD and the division control signal CTR_DV as substantially the same control signal.

Figure 9A:
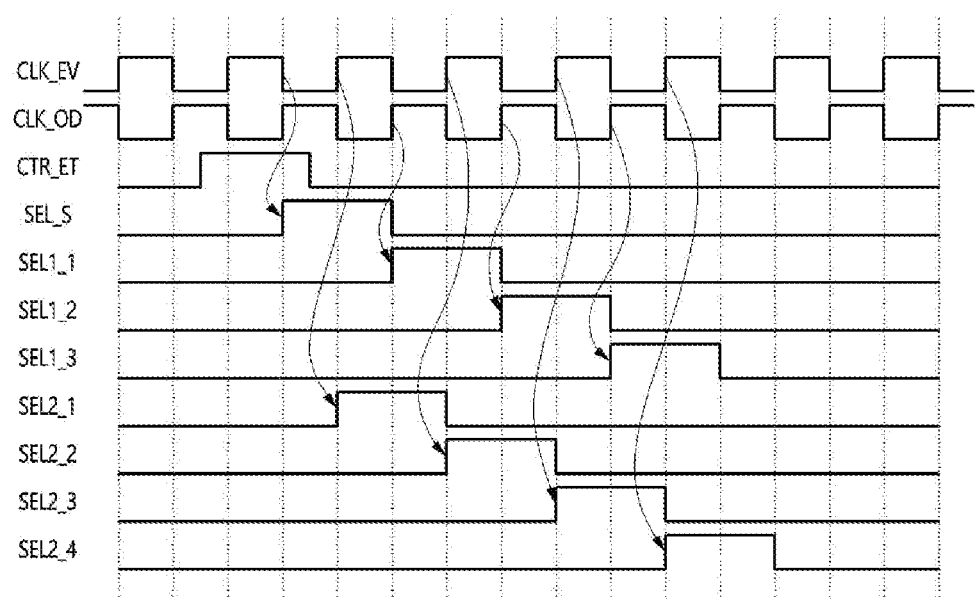
FIGS. 9A and 9B are waveform diagrams illustrating a circuit operation of the group control circuit in FIG. 4 to which the interval control circuit in FIG. 8 is applied in accordance with an embodiment of the present disclosure.
Figure 9B:
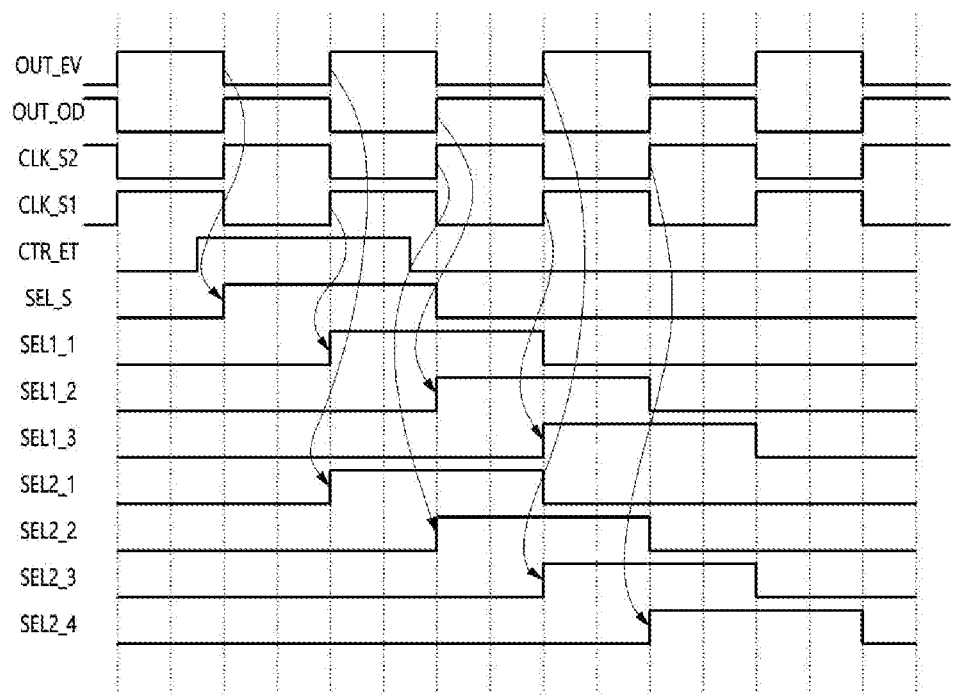

FIGS. 9A and 9B are waveform diagrams illustrating a circuit operation of the group control circuit 400 in FIG. 4 to which the interval control circuit 800 in FIG. 8 is applied in accordance with an embodiment of the present disclosure. As an example, the mode control signal CTR_MD and the division control signal CTR_DV are control signals corresponding to each other.

First, referring to FIG. 8 and FIG. 9A, in the 8-split operation mode, the interval control circuit 800 in FIG. 8 may output the first edge clock signal CLK_OD and the second edge clock signal CLK_EV on the basis of the division control signal CTR_DV. Accordingly, the group control circuit 400 in FIG. 4 may perform a circuit operation such that the source selection signal SEL_S and the first to third and the fourth to seventh activation selection signals SEL1_1 to SEL1_3 and SEL2_1 to SEL2_4 have eight transition points as illustrated in FIG. 9A. Accordingly, the group control circuit 400 may control the 8-split operation mode for the plurality of internal circuits on the basis of the source selection signal SEL_S and the first to third and the fourth to seventh activation selection signals SEL1_1 to SEL1_3 and SEL2_1 to SEL2_4. For reference, FIG. 9A may correspond to FIG. 3.

Next, referring to FIG. 8 and FIG. 9B, in the 5-split operation mode, the interval control circuit 800 in FIG. 8 may divide and output the first edge clock signal CLK_OD and divide and output the second edge clock signal CLK_EV on the basis of the division control signal CTR_DV. That is, the first clock control circuit 810 may generate the output signal OUT_OD obtained by adjusting the period of the first edge clock signal CLK_OD, and the second clock control circuit 820 may generate the output signal OUT_EV obtained by adjusting the period of the second edge clock signal CLK_EV.

Subsequently, the group control circuit 400 in FIG. 4 may generate the source selection signal SEL_S and the first to third and the fourth to seventh activation selection signals SEL1_1 to SEL1_3 and SEL2_1 to SEL2_4 on the basis of the output signal OUT_OD of the first clock control circuit 810 and the output signal OUT_EV of the second clock control circuit 820. The group control circuit 400 may perform a circuit operation such that the source selection signal SEL_S and the first to third and the fourth to seventh activation selection signals SEL1_1 to SEL1_3 and SEL2_1 to SEL2_4 have five transition points, as illustrated in FIG. 9B. Here, respective activation intervals of the source selection signal SEL_S and the first to third and the fourth to seventh activation selection signals SEL1_1 to SEL1_3 and SEL2_1 to SEL2_4 may be controlled to be twice as compared to FIG. 9A. Accordingly, the group control circuit 400 may control the 5-split operation mode for the plurality of internal circuits on the basis of the source selection signal SEL_S and the first to third and the fourth to seventh activation selection signals SEL1_1 to SEL1_3 and SEL2_1 to SEL2_4.

Hereinafter, for convenience of description, the first edge clock signal CLK_OD and the second edge clock signal CLK_EV each have a period of 100 ns.

In the case of FIG. 9A, the source selection signal SEL_S and the first to third and the fourth to seventh activation selection signals SEL1_1 to SEL1_3 and SEL2_1 to SEL2_4 may each have an activation interval of 50 ns. In the case of FIG. 9B, the source selection signal SEL_S and the first to third and the fourth to seventh activation selection signals SEL1_1 to SEL1_3 and SEL2_1 to SEL2_4 may each have an activation interval of 100 ns. Through such operations, the group control circuit 400 in accordance with an embodiment may variously adjust the activation interval together with the split operation mode.

Figure 10:
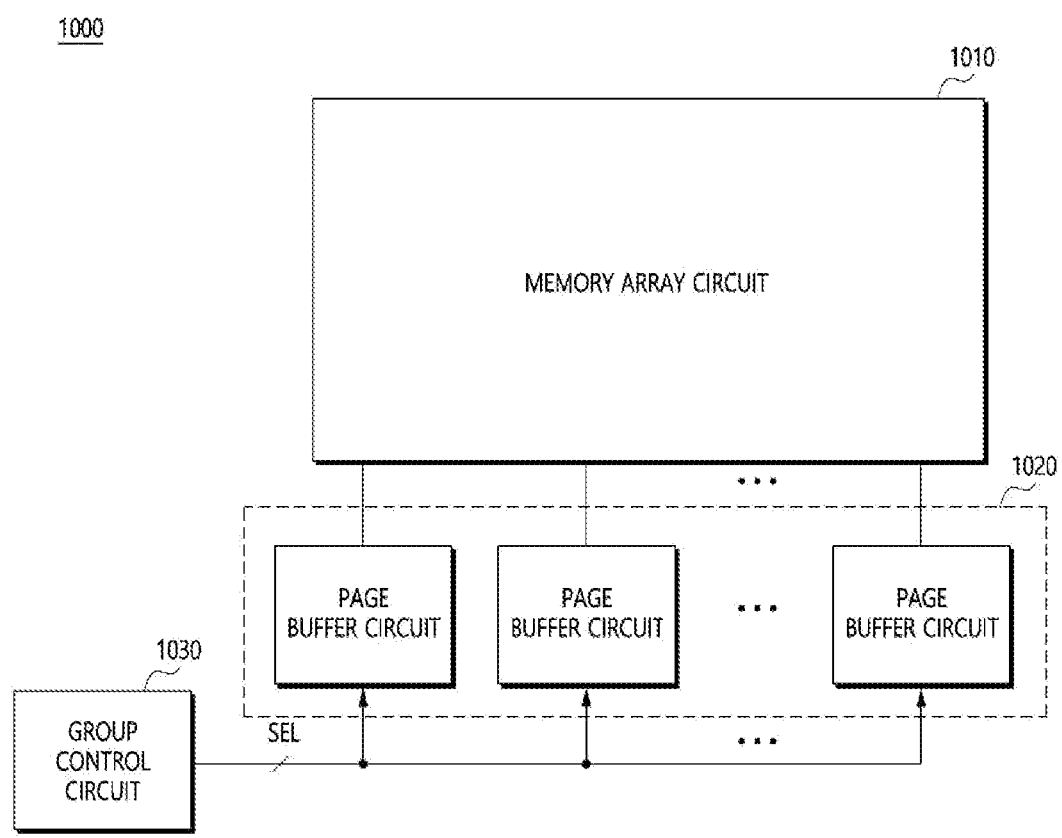
FIG. 10 is a block diagram illustrating a configuration of a semiconductor memory apparatus in accordance with an embodiment of the present disclosure.

FIG. 10 is a block diagram illustrating a configuration of a semiconductor memory apparatus 1000 in accordance with an embodiment of the present disclosure.

Referring to FIG. 10, the semiconductor memory apparatus 1000 may include a memory array circuit 1010, a plurality of page buffer circuits 1020, and a group control circuit 1030.

First, the memory array circuit 1010 may be configured to store data. The memory array circuit 1010 may be comprised of a plurality of memory cells. The semiconductor memory apparatus 1000 may store data in the plurality of memory cells during a write operation, and may output the data stored in the plurality of memory cells during a read operation.

Next, the plurality of page buffer circuits 1020 may be electrically connected to the memory cells included in the memory array circuit 1010. The plurality of page buffer circuits 1020 may be configured to control the read and write operations of the memory array circuit 1010. The plurality of page buffer circuits 1020 may be activated on the basis of a plurality of activation selection signals SEL.

Next, the group control circuit 1030 may be configured to generate the plurality of activation selection signals SEL. The group control circuit 1030 may correspond to the configuration and operation described with reference to FIG. 1 to FIG. 9B. The plurality of activation selection signals SEL may include the plurality of activation selection signals SEL1_1 to SEL1_N and SEL2_1 to SEL2_M in FIG. 1, and may include the source selection signal SEL_S and the first to third and the fourth to seventh activation selection signals SEL1_1 to SEL1_3 and SEL2_1 to SEL2_4 described with reference to FIG. 2 to FIG. 9B. Since the plurality of activation selection signals SEL have already been described with reference to FIG. 1 to FIG. 9B, a detailed description thereof will be omitted.

Therefore, the semiconductor memory apparatus 1000 in accordance with an embodiment may variously control an activation operation on the plurality of page buffer circuits 1020, which correspond to the plurality of internal circuits, on the basis of the plurality of activation selection signals SEL.

In accordance with an embodiment, the plurality of internal circuits are sequentially activated to prevent a drop in a supply voltage, thereby improving stability and reliability of the circuit operation.

Effects of the present disclosure are not limited to the aforementioned effects, and other effects not described above may be evidently understood by those skilled in the art, to which the present disclosure pertains, from the above description.

Although various embodiments have been described for illustrative purposes, it will be apparent to those skilled in the art that various changes and modifications may be made without departing from the spirit and scope of the disclosure as defined in the following claims.

What is claimed is:
1. A group control circuit comprising:
  a selection signal generation circuit configured to generate
    a source selection signal by synchronizing an entry
    control signal with one of a first edge clock signal and
    a second edge clock signal;

a first activation selection circuit configured to generate a plurality of first activation selection signals that are sequentially activated by synchronizing the source selection signal with the first edge clock signal; and a second activation selection circuit configured to generate a plurality of second activation selection signals that are sequentially activated by synchronizing the source selection signal with the second edge clock signal, wherein the first activation selection circuit and the second activation selection circuit have a parallel structure and the first edge clock signal and the second edge clock signal have different phases.

2. The group control circuit according to claim 1, wherein the first edge clock signal and the second edge clock signal have a phase difference of 180°.

3. The group control circuit according to claim 1, wherein the selection signal generation circuit comprises a synchronization circuit configured to output the source selection signal by synchronizing the entry control signal with one of the first edge clock signal and the second edge clock signal.

4. The group control circuit according to claim 1, wherein the first activation selection circuit comprises a plurality of synchronization circuits configured to output the plurality of first activation selection signals through a shifting operation on the source selection signal on the basis of the first edge clock signal.

5. The group control circuit according to claim 1, wherein the second activation selection circuit comprises a plurality of synchronization circuits configured to output the plurality of second activation selection signals through a shifting operation on the source selection signal on the basis of the second edge clock signal.

6. The group control circuit according to claim 1, further comprising an interval control circuit configured to adjust respective activation intervals of the source selection signal and the plurality of first and second activation selection signals.

7. The group control circuit according to claim 6, wherein the interval control circuit comprises:
a first clock control circuit configured to adjust a period of the first edge clock signal on the basis of a division control signal; and
a second clock control circuit configured to adjust a period of the second edge clock signal on the basis of the division control signal.

8. A group control circuit comprising:
a selection clock generation circuit configured to generate first and second selection clock signals respectively from first and second edge clock signals or vice versa, on the basis of a mode control signal;
a selection signal generation circuit configured to generate a source selection signal by synchronizing an entry control signal with one of the first and second edge clock signals;
a first activation selection circuit configured to generate a plurality of first activation selection signals that are sequentially activated by alternately synchronizing the source selection signal with the first edge clock signal and the first selection clock signal; and
a second activation selection circuit configured to generate a plurality of second activation selection signals that are sequentially activated by alternately synchronizing the source selection signal with the second edge clock signal and the second selection clock signal,
wherein the first activation selection circuit and the second activation selection circuit have a parallel structure and the first edge clock signal and the second edge clock signal have different phases.

9. The group control circuit according to claim 8, wherein the first edge clock signal and the second edge clock signal have a phase difference of 180°.

10. The group control circuit according to claim 8, wherein the selection clock generation circuit comprises:
a multiplexing circuit configured to output the first edge clock signal or the second edge clock signal as the first selection clock signal on the basis of the mode control signal; and
an inversion circuit configured to output the second selection clock signal by inverting the first selection clock signal.

11. The group control circuit according to claim 8, wherein the selection signal generation circuit comprises a synchronization circuit configured to output the source selection signal by synchronizing the entry control signal with one of the first and second edge clock signals.

12. The group control circuit according to claim 8, wherein the first activation selection circuit comprises a plurality of synchronization circuits configured to output the plurality of first activation selection signals through a shifting operation on the source selection signal on the basis of the first edge clock signal and the first selection clock signal.

13. The group control circuit according to claim 8, wherein the second activation selection circuit comprises a plurality of synchronization circuits configured to output the plurality of second activation selection signals through a shifting operation on the source selection signal on the basis of the second edge clock signal and the second selection clock signal.

14. The group control circuit according to claim 8, further comprising an interval control circuit configured to adjust respective activation intervals of the source selection signal and the plurality of first and second activation selection signals.

15. The group control circuit according to claim 14, wherein the interval control circuit comprises:
a first clock control circuit configured to adjust a period of the first edge clock signal on the basis of a division control signal; and
a second clock control circuit configured to adjust a period of the second edge clock signal on the basis of the division control signal.

16. The group control circuit according to claim 15, wherein the division control signal and the mode control signal are control signals corresponding to each other.

17. A semiconductor memory apparatus comprising:
a group control circuit including:
a selection signal generation circuit configured to generate a source selection signal by synchronizing an entry control signal with one of a first edge clock signal and a second edge clock signal,
a first activation selection circuit configured to generate a plurality of first activation selection signals that are sequentially activated by synchronizing the source selection signal with the first edge clock signal, and
a second activation selection circuit configured to generate a plurality of second activation selection signals that are sequentially activated by synchronizing the source selection signal with the second edge clock signal; and
a plurality of page buffer circuits activated on the basis of the plurality of first and second activation selection signals and configured to control read and write operations of a memory array circuit, wherein the first activation selection circuit and the second activation selection circuit have a parallel structure and the first edge clock signal and the second edge clock signal have different phases.

18. A semiconductor memory apparatus comprising:
a group control circuit including:
a selection clock generation circuit configured to generate first and second selection clock signals respectively from first and second edge clock signals or vice versa, on the basis of a mode control signal,
a selection signal generation circuit configured to generate a source selection signal by synchronizing an entry control signal with one of the first and second edge clock signals,
a first activation selection circuit configured to generate a plurality of first activation selection signals that are sequentially activated by alternately synchronizing the source selection signal with the first edge clock signal and the first selection clock signal, and
a second activation selection circuit configured to generate a plurality of second activation selection signals that are sequentially activated by alternately synchronizing the source selection signal with the second edge clock signal and the second selection clock signal; and
a plurality of page buffer circuits activated on the basis of the plurality of first and second activation selection signals and configured to control read and write operations of a memory array circuit,
wherein the first activation selection circuit and the second activation selection circuit have a parallel structure and the first edge clock signal and the second edge clock signal have different phases.

19. The semiconductor memory apparatus according to claim 18, wherein the first activation selection circuit comprises a plurality of synchronization circuits configured to output the plurality of first activation selection signals through a shifting operation on the source selection signal on the basis of the first edge clock signal and the first selection clock signal.

20. The semiconductor memory apparatus according to claim 18, wherein the second activation selection circuit comprises a plurality of synchronization circuits configured to output the plurality of second activation selection signals through a shifting operation on the source selection signal on the basis of the second edge clock signal and the second selection clock signal.

* * * * *